(12) United States Patent
Yamaguchi et al.

(10) Patent No.: US 7,691,540 B2
(45) Date of Patent: Apr. 6, 2010

(54) EXPOSURE MASK, METHOD OF DESIGNING AND MANUFACTURING THE SAME, EXPOSURE METHOD AND APPARATUS, PATTERN FORMING METHOD, AND DEVICE MANUFACTURING METHOD

(75) Inventors: Takako Yamaguchi, Atsugi (JP); Yasuhisa Inao, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 948 days.

(21) Appl. No.: 10/529,891

(22) PCT Filed: Jun. 25, 2004

(86) PCT No.: PCT/JP2004/009375

§ 371 (c)(1),
(2), (4) Date: Jul. 26, 2005

(87) PCT Pub. No.: WO2005/001569

PCT Pub. Date: Jan. 6, 2005

(65) Prior Publication Data

US 2006/0003233 A1    Jan. 5, 2006

(30) Foreign Application Priority Data

Jun. 26, 2003 (JP) .............................. 2003-182041
Mar. 30, 2004 (JP) .............................. 2004-097699

(51) Int. Cl.
*G03F 1/00* (2006.01)
*G06F 17/50* (2006.01)

(52) U.S. Cl. .................. 430/5; 716/19; 716/20

(58) Field of Classification Search ............ 430/5; 716/19, 20, 21; 700/119–121; 378/34–35; 250/492.2–492.3

See application file for complete search history.

(56) References Cited

U.S. PATENT DOCUMENTS 6,171,730 B1    1/2001    Kuroda et al. .................. 430/5

(Continued)

FOREIGN PATENT DOCUMENTS

JP    11-317345    11/1999

(Continued)

OTHER PUBLICATIONS

International Search Report mailed Sep. 27, 2004, issued in corresponding International Application No. PCT/JP2004/09375.

(Continued)

*Primary Examiner*—Mark F Huff
*Assistant Examiner*—Jonathan Jelsma
(74) *Attorney, Agent, or Firm*—Fitzpatrick, Cella, Harper & Scinto

(57) ABSTRACT

A method of designing an exposure mask for exposing an image forming layer provided on a substrate, by use of near field light leaking from adjoining openings formed in a light blocking member. The method includes determining a width D of the openings and an opening interval of the openings to be formed in the light blocking member, in which a relation $D \leq (P-W-2T)$ is satisfied where T is the height of a pattern to be produced by the image forming layer, W is the linewidth of the pattern and P is the pitch of the pattern, so that an electrical field distribution, adjacent to the opening of the light blocking member as exposure light is projected on the light blocking member, is approximated to an electrical field model extending concentric-circularly with an edge of the light blocking member at an image forming layer side as a center.

2 Claims, 7 Drawing Sheets

U.S. PATENT DOCUMENTS

| | | | |
|---|---|---|---|
| 6,497,996 B1 | 12/2002 | Naya et al. | 430/323 |
| 6,559,926 B2 | 5/2003 | Yamaguchi et al. | 355/53 |
| 6,628,392 B2 | 9/2003 | Kuroda et al. | 356/400 |
| 6,632,593 B2 | 10/2003 | Yamaguchi et al. | 430/322 |
| 6,671,034 B1 | 12/2003 | Hatakeyama et al. | 355/67 |
| 6,720,115 B2 | 4/2004 | Inao et al. | 430/5 |
| 7,001,696 B2 | 2/2006 | Inao et al. | 430/5 |
| 2001/0046719 A1 | 11/2001 | Yamaguchi et al. | 438/11 |
| 2003/0129545 A1 | 7/2003 | Kik et al. | 430/313 |
| 2004/0023161 A1 | 2/2004 | Yamaguchi et al. | 430/311 |
| 2004/0090610 A1 | 5/2004 | Hatakeyama et al. | 355/67 |
| 2004/0121245 A1 | 6/2004 | Inao et al. | 430/5 |
| 2004/0166421 A1 | 8/2004 | Yamaguchi et al. | 430/5 |
| 2005/0057752 A1 | 3/2005 | Inao et al. | 356/400 |
| 2005/0064301 A1 | 3/2005 | Yamaguchi et al. | 430/5 |
| 2006/0003236 A1 | 1/2006 | Mizutani et al. | 430/5 |
| 2006/0003269 A1 | 1/2006 | Ito et al. | 430/323 |
| 2006/0007440 A1 | 1/2006 | Kuroda et al. | 356/400 |
| 2006/0014108 A1 | 1/2006 | Ito et al. | 430/322 |

FOREIGN PATENT DOCUMENTS

| | | |
|---|---|---|
| WO | WO 03/001869 A2 | 1/2003 |

OTHER PUBLICATIONS

Written Opinion mailed Sep. 27, 2004, issued in International Application No. PCT/JP2004/09375.

McNab, S. J., et al., "Analytic study of gratings patterned by evanescent near field optical lithography," J. Vac. Sci. Technol. B 18(6), Nov./Dec. 2000, pp. 2900-2904.

Luo, Xiangang, et al., "Surface plasmon resonant interference nanolithography technique," Applied Physics Letters, vol. 84, No. 23, Jun. 7, 2004, pp. 4780-4782.

Alkaisi, Maan M., et al., "Nanolithography in the Evanescent Near Field," Advanced Materials, 13, No. 12-13, Jul. 4, 2001, pp. 877-887.

Communication pursuant to Article 96(2) EPC dated May 3, 2006, issued in corresponding European patent application No. 04 746 844.2.

Communication pursuant to Article 94(3) EPC, mailed in a Communication dated Dec. 9, 2008, in copending European patent application No. 04 746 844.2.

US 7,691,540 B2

EXPOSURE MASK, METHOD OF DESIGNING AND MANUFACTURING THE SAME, EXPOSURE METHOD AND APPARATUS, PATTERN FORMING METHOD, AND DEVICE MANUFACTURING METHOD

This application claims priority from Japanese Patent Application No. 2003-182041, filed Jun. 26, 2003, and Japanese Patent Application No. 2004-097699, filed Mar. 30, 2004, which are hereby incorporated by reference herein.

TECHNICAL FIELD

This invention relates generally to near field exposure technology that enables the production of a fine pattern and, more particularly, to an exposure mask, a method of designing and manufacturing an exposure mask, an exposure method and apparatus, a pattern forming method, and a device manufacturing method, for example.

BACKGROUND ART

Increasing capacity of a semiconductor memory and increasing speed and density of a CPU processor have inevitably necessitated further improvements in fineness of microprocessing through optical lithography. Generally, the limit of microprocessing with an optical lithographic apparatus is on an order of the wavelength of light used. Thus, the wavelength of light used in optical lithographic apparatuses has been shortened more and more. Currently, a near ultraviolet laser is used, and microprocessing on the 0.1 μm order is enabled. While the fineness is being improved in the optical lithography, in order to assure microprocessing of 0.1 μm or narrower, there still remain many unsolved problems, such as further shortening of laser wavelengths, development of lenses usable in such a wavelength region, and the like.

On the other hand, as a measure for enabling microprocessing of 0.1 μm order or narrower, a microprocessing apparatus using a structure of a near-field optical microscope (scanning near-field optical microscope: SNOM), has been proposed. An example is an exposure apparatus in which, by use of evanescent light leaking from a fine opening of a size not greater than 100 nm, local exposure that exceeds the light wavelength limit is performed to a resist.

However, since such a lithographic apparatus with an SNOM structure is arranged to execute the microprocessing by use of one or more processing probes, as in continuous drawing there is a problem that the throughput is not high.

As one method for solving such a problem, U.S. Pat. No. 6,171,730 proposes an exposure method in which a photomask, having a pattern arranged so that near field light leaks from a light blocking film, is closely contacted to a photoresist upon a substrate, whereby a fine pattern of the photomask is transferred to the photoresist at once.

The method and apparatus disclosed in the aforementioned U.S. patent is very useful and it makes a large contribution to the technical field to which the present invention pertains.

Also, Japanese Laid-Open Patent Application No. 11-317345 and U.S. Pat. No. 6,497,996 disclose that such near field light has a property that the intensity is attenuated as with an exponential function, with the distance from the fine opening, and, thus, the film thickness of a pattern forming layer based on the near field exposure has to be made thin.

FIG. 2 illustrates a near-field electrical field distribution around a mask opening obtained by investigation made through simulations. Specifically, FIG. 2 shows the state of an electrical field distribution produced adjacent to the opening, where light having a wavelength of 436 nm is projected to a near-field exposure mask having a pitch of 200 nm and a mask opening width of 70 nm. Values in the drawing are relative electrical field intensities at respective positions where the intensity of incident light is taken as one.

Seeing the electrical field distribution, there is an extension from the opening to the light blocking film portion. This means that there is a possibility that the opening pattern of the mask and the pattern provided by exposure do not completely correspond to each other.

The feature that the electrical field intensity attenuates as coming away from the mask opening and that there appears an electrical field distribution being extended in a direction parallel to the mask surface, such as depicted in FIG. 2, is peculiar to the near field.

Generally, making an exposure mask takes a very long time and is expensive. In the mask pattern production for near field exposure, particularly, the mask design should be done while taking into account this electrical field distribution.

On the other hand, as the pattern width to be produced becomes narrower, the mask design should be made while more exactly taking into account the extension described above.

However, if the mask opening width having an electrical field distribution that can meet various pattern linewidths and pitches is sought through complicated simulations using many varieties of parameters, it takes a long time to complete the simulation and analysis. Consequently, it causes a problem that the mask designing also requires a long time.

DISCLOSURE OF THE INVENTION

It is accordingly an object of the present invention to provide an exposure mask, an exposure mask designing and manufacturing method, an exposure method and apparatus, a pattern forming method and/or a device manufacturing method, by which at least one of the inconveniences described above can be solved, and by which a mask structure can be accomplished easily while taking into account the electrical field distribution peculiar to the near field, without the necessity of complicated simulation, which requires a long time.

The present invention can provide an exposure mask, an exposure mask designing and manufacturing method, an exposure method and apparatus, a pattern forming method and a device manufacturing method, which may take the following forms, for example:

(1) An exposure mask for exposing an image forming layer provided on a substrate, by use of near field light leaking from adjoining openings formed in a light blocking member, characterized in that the light blocking film has an opening interval that is determined so that an electrical field distribution at the image forming layer side of the opening, to be defined as exposure light, is projected on the light blocking member and has a correlation with an eccentric model of an electrical field distribution as determined by a linewidth and a height of a pattern to be produced.

(2) An exposure mask for exposing an image forming layer provided on a substrate, by use of near field light leaking from adjoining openings formed in a light blocking member, characterized in that a relation $K \geq (W+2T)$ is satisfied, where T is the height of a pattern to be produced by use of the image forming layer, W is the linewidth of the pattern, and K is the width of the light blocking member being present between adjacent openings.

(3) An exposure mask for exposing an image forming layer provided on a substrate, by use of near field light leaking from adjoining openings formed in a light blocking member, characterized in that a relation $D \leqq (P-W-2T)$ is satisfied, where T is the height of a pattern to be produced by use of the image forming layer, W is the linewidth of the pattern, P is the pitch of the pattern, and D is the width of the opening.

(4) An exposure mask for exposing an image forming layer provided on a substrate, by use of near field light leaking from adjoining openings formed in a light blocking member, characterized in that a relation $D=\{P-W-2T(1+\alpha)\}$ is substantially satisfied where T is the height of a pattern to be produced by use of the image forming layer, W is the linewidth of the pattern, P is the pitch of the pattern, and D is the width of the opening, while taking into account a process margin α after the exposure.

(5) An exposure mask as mentioned in item (3) or (4) above, wherein the value of the pitch is made not greater than the wavelength of a surface plasmon polariton wave to be produced on the basis of the light blocking member.

(6) An exposure mask as mentioned in any one of items (1) to (5), wherein the openings of the mask have a two-dimensional shape or they are arranged two-dimensionally, with respect to a direction along the surface of the light blocking member where the openings are formed.

(7) A method of designing an exposure mask for exposing an image forming layer provided on a substrate, by use of near field light leaking from adjoining openings formed in a light blocking member, characterized in that: an opening interval of the light blocking film is determined on the basis of a linewidth and a height of a pattern to be produced by use of the image forming layer.

(8) A method of manufacturing an exposure mask for exposing an image forming layer provided on a substrate, by use of near field light leaking from adjoining openings formed in a light blocking member, characterized in that an opening interval of the light blocking film is determined on the basis of a linewidth and a height of a pattern to be produced by use of the image forming layer, and that, the light blocking member is subsequently processed so as to obtain the thus determined opening interval.

(9) An exposure method for exposing an image forming layer provided on a substrate, by use of an exposure mask having a light blocking member with an opening and on the basis of near field light leaking from the opening, characterized by a step of preparing an exposure mask as in any one of items (1) to (6), a step of approximating the near-field exposure mask and the image forming layer to each other, up to a distance not greater than a near field region, and an exposure step for irradiating the image forming layer with exposure light through the exposure mask.

(10) An exposure method as mentioned in item (9), wherein, when P is the pitch of a pattern to be produced by use of the image forming layer, D is the width of the opening, W' is the linewidth, and T' is the pattern height, through adjustment of an exposure amount in the exposure step and of another condition or conditions, exposure is carried out to satisfy a relation $(W'+2T') \leqq (P-D)$.

(11) A pattern forming method including an exposure step for exposing an image forming layer on the basis of near field light and by use of a near-field exposure mask having a light blocking member with openings having a pitch P and an opening width D, and a developing step for developing the exposed image forming layer, characterized in that through adjustment of an exposure amount in the exposure step and a developing condition in the developing step, a pattern having a linewidth W and a height T satisfying a relation $(W+2T) \leqq (P-D)$ is produced.

(12) A method as in item (11), wherein, when a minimum value of the height T of the pattern is determined as T" due to a process after the pattern formation, a pattern having a linewidth W that satisfies a relation $W<(P-D-2T")$ is produced.

(13) A device manufacturing method characterized by including an exposure step for exposing a process object by use of an exposure method as in item (9), and a developing step for developing the exposed process object, wherein, after these steps, a predetermined process is conducted to the process object, whereby a device is manufactured.

(14) An exposure apparatus, including light irradiating means and an exposure mask, for exposing a process object provided on a substrate, by use of near field light leaking from a plurality of openings formed in a light blocking member of the mask, characterized in that as the exposure mask, the exposure apparatus comprises an exposure mask as in any one of items (1) to (6).

In accordance with the present invention, it is possible to accomplish an exposure mask, an exposure mask designing and manufacturing method, an exposure method and apparatus, a pattern forming method and/or a device manufacturing method, by which a mask structure can be accomplished easily, while taking into account the electrical field distribution peculiar to the near field, without the necessity of a complicated simulation that requires a long time. Therefore, design and production of a near-field exposure mask can be achieved efficiently. Particularly, in the production of a desired fine pattern not greater than the wavelength of light used for the exposure, the throughput can be improved significantly and, thus, the cost can be decreased well.

These and other objects, features and advantages of the present invention will become more apparent upon a consideration of the following description of the preferred embodiments of the present invention, taken in conjunction with the accompanying drawings.

BRIEF DESCRIPTION OF THE DRAWINGS

FIG. 10A shows a resist pattern obtainable when a mask that has a light blocking metal film having a ring-like shaped is used.

BEST MODE FOR PRACTICING THE INVENTION

In accordance with one aspect, the present invention provides an exposure mask, an exposure mask designing and manufacturing method, an exposure method and apparatus, a pattern forming method and/or a device manufacturing method, by which a mask structure can be accomplished easily while taking into account the electrical field distribution peculiar to the near field, without the necessity of a complicated simulation that requires a long time. This is based on the following findings acquired by the inventors of the present invention.

Namely, in the mask designing taking into account the extension peculiar to the near field, from simulations, it has been found that the electrical field distribution adjacent to the opening of a mask from which near field light emits takes the form of an electrical field distribution having an approximately concentric extension. Also, it has been found that such an electrical field distribution can be approximated by a concentric-circle model, and that, by using such a concentric-circle model and from the pattern width W and pattern height T (pitch P in the case of a periodic pattern), the structure of a near-field exposure mask to be prepared can be determined easily by equations, without the necessity of simulations.

This will be explained in greater detail.

Figure 2:
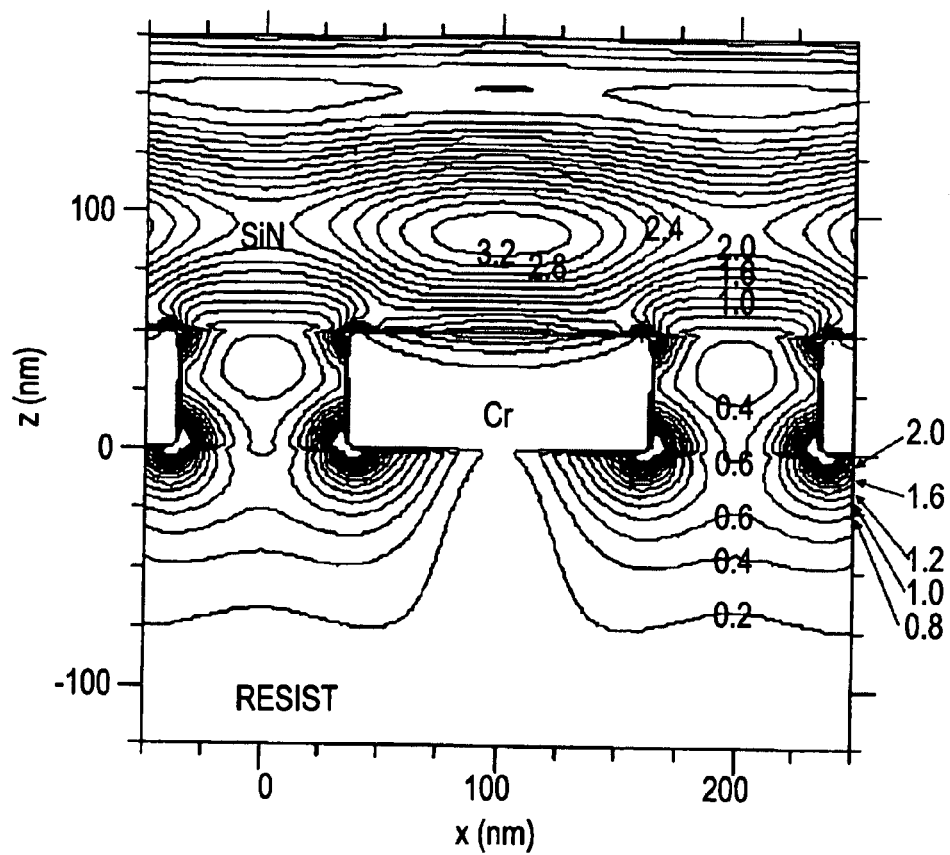
FIG. 2 is a schematic view for explaining the present invention and, specifically, it illustrates a simulation result that shows an electrical field intensity produced adjacent to the openings.

FIG. 2 shows a near-field electrical field distribution produced near fine openings. This is the result of a simulation made by the use of a kind of GMT (Generalized Multipole Technique) program, that is, "Max-1" (C. Hafner, Max-1, A Visual Electromagnetics Platform, Wiley, Chichester, UK, 1998). GMT is one analysis method of a Maxwell equation, wherein a scattered wave is described, while a multipole is placed as a virtual source. As regards a mask base material 102, SiN was used and, regarding a light blocking film 101, Cr was used. The pitch of the fine opening pattern was 200 nm, and the opening width was 70 nm. The incident wavelength was 436 nm.

Numerical values (0.2, 0.4, 0.6, ... 1.0, 1.2, and so on) in the drawing are a relative electrical field intensity where the electrical field intensity of the incident light is taken as 1.0.

FIG. 2 in fact illustrates an electrical field distribution peculiar to the near field, wherein the intensity decreases as in an exponential function, as coming away from the fine opening. Analyzing this distribution in greater detail, it has been found that the electrical field intensity takes a peak value at an edge portion, at the light blocking film, of the fine opening and, from there, the intensity attenuates to expand as a concentric circle. Also, it has been found that, even with a different opening width or opening interval or a different pitch pattern, simulation of an electrical field distribution to the near-field mask shows similar results, particularly when, for a periodic pattern, the pitch of the fine opening pattern is not greater than the surface plasmon polariton wave, and the light blocking film is made of a different material, that is, Au or Ta.

In the present invention, the term "opening width" refers to the width of an opening defined by forming a light blocking film, constituting a mask, where no light blocking film is present there. Specifically, in FIG. 1, for example, the portion denoted at Dmax corresponds to it. Also, the term "opening interval" refers to the distance between two adjacent openings, that is, the width of the light blocking film there. Specifically, in FIG. 11, for example, the portion denoted at Kmin corresponds to it.

Figure 3:
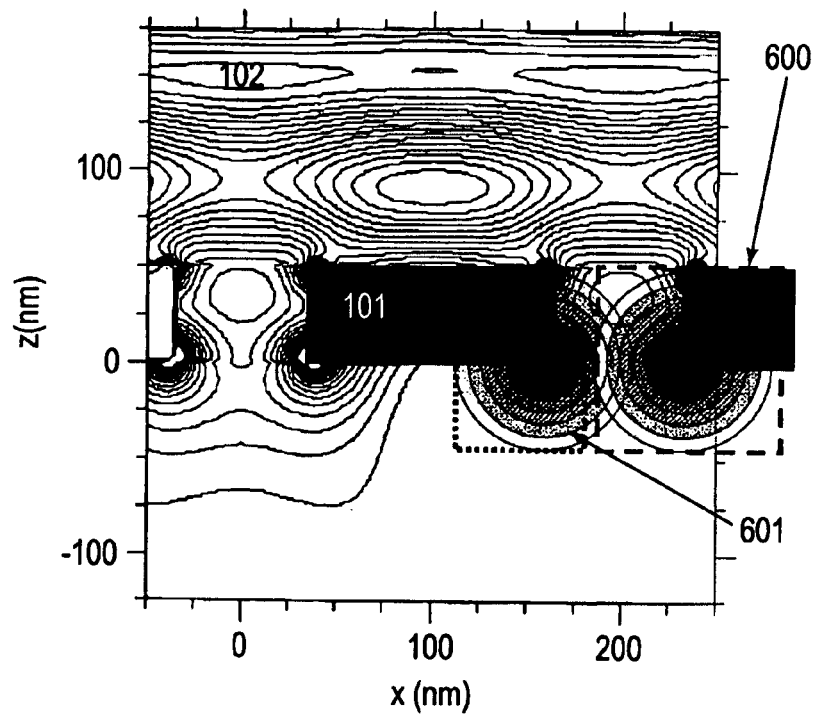
FIG. 3 is a schematic view for explaining the present invention and, specifically, it illustrates a simulation result that shows an electrical field intensity produced adjacent to the openings, as well as a concentric-circle model.

Modeling such a distribution, FIG. 3 illustrates a combined result of a modeled near-field distribution (right-hand side of FIG. 3) and the simulation results of FIG. 2 (left-hand side of FIG. 3). In FIG. 3, for simplicity of illustration, a portion of the field contour line shown in FIG. 2 is omitted.

It is seen from FIG. 3 that, through a concentric-circle model 600, a distribution adjacent to the light blocking film edge portion and a distribution from the edge portion to a portion 601, below the light blocking film, are quite well approximated. Namely, the concentric-circle model 600 depicts well the feature that the extension distance in the film-thickness direction (downward direction in FIG. 3) in the simulation result and the extension distance in a direction parallel to the mask surface (horizontal direction as viewed in FIG. 3) are similar to each other.

To the contrary, in this model, except the light blocking film edge portion and the portion from the edge portion to the portion below the light blocking film, that is, at a portion below the opening (as long as a produced pattern of exposure concerns), the electrical field distribution is not approximated well. Particularly, as the opening width becomes wider, the electrical field intensity distribution deviates off the model. Since, however, from the simulation result, there is a tendency that the electrical field intensity below the opening increases as the opening width becomes wider, it can be considered that the portion below the opening is exposed constantly. Actually, in practical experiments, a result corresponding to the simulation result was obtained at the portion below the opening.

By using this model, the structure of a near-field exposure mask to be prepared in order to obtain a desired pattern can be determined without the necessity of complicated and massive simulations using various parameters and analyses of the results. This will be described in detail, below.

Once the type of the image forming layer is fixed, the pattern to be produced in the image forming layer can be determined by exposure amount and developing condition. Thus, when an electrical field distribution having a concentric extension as that of the above-described model is produced, the pattern width thereof can have a freedom if the exposure amount and developing condition are chosen appropriately.

First of all, a case when a desired pattern to be produced is a periodic pattern will be explained. For a periodic pattern having a pitch P, also, the pitch of the mask fine opening pattern should be equal to P. For production of one having a pattern width W, from the concentric-circle model described above, a relation of the following equation (1) should be satisfied between the maximum value Dmax of the mask opening width and the film thickness T of the image forming layer:

$$D\max = P - W - 2 \times T \qquad (1)$$

If the relation described with respect to D as the mask opening width is not limited to a maximum value, it can be set forth as follows:

$$D \leq P - W - 2T.$$

Here, T is the pattern height of the image forming layer 401 as determined by a subsequent process or processes.

Figure 1:
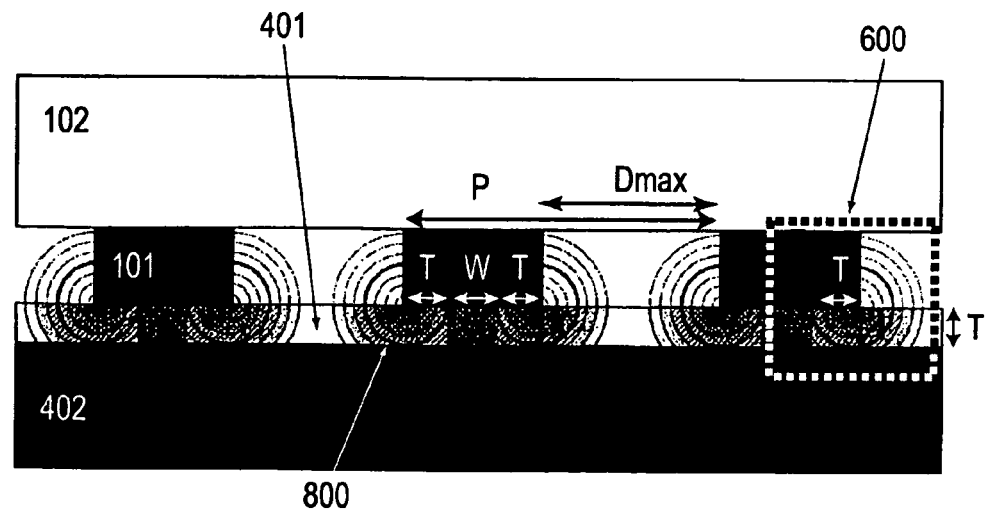
FIG. 1 is a schematic view for explaining the present invention and, specifically, it illustrates how to determine an opening width of a near-field exposure mask on the basis of a concentric-circle model.

FIG. 1 shows the relationship of values in equation (1). Thus, referring to the drawing, equation (1) will be explained in greater detail. First, the pattern height T of the image forming layer 401, by which a desired processing depth of a process object substrate 402 can be processed, is determined on the basis of a process condition, such as etching durability, for example. In order to make a pattern of this height T, it is necessary that a pattern after development is produced at the field contour line portion outside the field contour line 800, depicted by a thick line in FIG. 1.

The electrical field distribution below the light blocking film 101 is well approximated by a concentric-circle model 600, as described hereinbefore. It is seen from FIG. 1 that the extension from the edge portion of the light blocking film 1 is approximately even, both in regard to the film thickness direction (downward direction as viewed in FIG. 1) and in a direction parallel to the mask surface (horizontal direction as viewed in FIG. 1). Therefore, if a pattern after development is produced at the electrical field contour line 800 or any electrical field contour line outside the line 800, it assures a result that a developed pattern having an extension not less than a distance T, from the edge portion of the light blocking film 101, even in the direction parallel to the mask surface, is produced.

The extension phenomenon from the edge portion of the light blocking film 101 similarly occurs at the opposite side edge of the light blocking film 101.

Thus, the largest opening width Dmax of the near-field exposure mask, effective to produce a pattern having a pattern width W just underneath the light blocking film 101, can be set as defined in equation (1), by using the pattern pitch P, width W and height T.

As regards the image forming layer, any material may be used provided that a reaction occurs in response to the near field from the opening and it can bear a process after the pattern formation. As regards the versatility, however, use of a photoresist is preferable.

The value T may be determined by a process or processes after the pattern formation and, more specifically, the etching durability in the etching process for the process object substrate, or the film thickness of vapor deposition in the lift-off, for example.

Although it is desirable that a pattern having a thickness sufficient to provide durability to the processing for the process object substrate can be produced only by the image forming layer, if a thickness not less than (P−W)/2 is necessary, a buffer layer may be prepared between the image forming layer 401 and the process object substrate.

The buffer layer may be a resist layer, an oxide film layer, or a metal layer, for example, not processed, or, alternatively, processed so as to provide a physical property different from the image forming layer, such as, for example, hard baking or non-silylating in a case where a surface imaging method (e.g., a multilayer resist method or a surface layer silylating method), for example, is used. The buffer layer may be a single layer or it may comprise plural layers. By transferring a pattern, having been formed in the image forming layer 401 on the basis of near field exposure, to such a buffer layer in accordance with a method such as a dry etching method, for example, one having a thickness sufficiently durable to the processing to be made to the process object substrate can be produced.

The value by which the opening width D becomes equal to Dmax is the value by which the process margin becomes equal to zero. In this specification, the term "process margin" refers to a factor that defines the tolerance of a process with which a desired pattern height T and a desired pattern linewidth can be assuredly obtainable even taking into account a process to be performed after the exposure.

The process margin "zero" means that the margin for the process condition, such as an exposure developing condition for the pattern formation or the process after the pattern formation, such as etching or vapor deposition, is zero. With such a "zero" margin, actually, it is very difficult to perform the pattern formation and subsequent processes for the process object substrate.

Therefore, while taking into account the process margin, the value of the opening width D should desirably be made smaller than Dmax, as given by equation (2) below:

$$D = P - W - 2T(1+\alpha) \tag{2}$$

wherein α is the process margin. More specifically, it may be a component of an overall film thickness dissolution during the development of an image forming layer, or a component of dissolution in a direction parallel to the substrate surface during the development of the image forming layer, for example.

While the value α varies largely with the process, in many cases, it takes a value of $0 \leq \alpha \leq 4$. If equation (2) takes a negative value in dependence upon the value of α, a buffer layer may be provided between the image forming layer and the process object substrate as described hereinbefore, to reduce the values of α and T of the effective image forming layer, such that the opening width D having an effective and positive value can be set.

Figure 4:
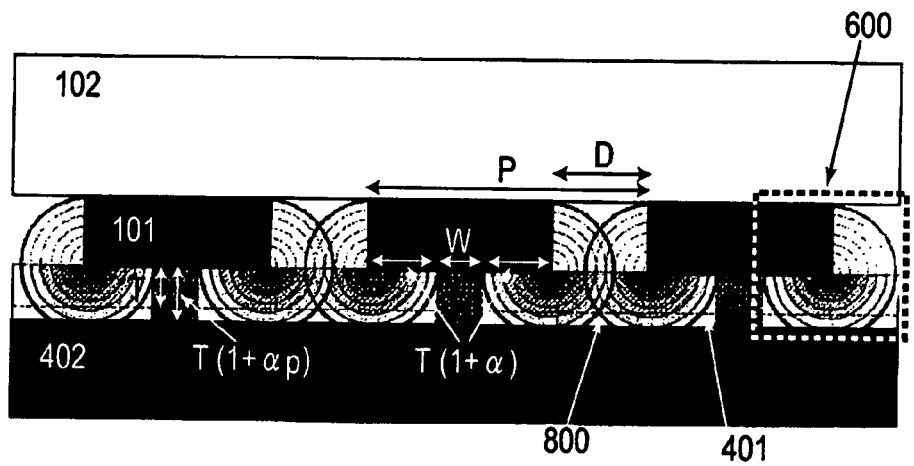
FIG. 4 is a schematic view for explaining how to determine an opening width of a near-field exposure mask on the basis of a concentric-circle model, in accordance with an embodiment of the present invention.

FIG. 4 shows the relationships of these values. The reference "αp" in FIG. 4 is a value as determined by a relation $0 \leq \alpha p \leq \alpha$. While α is defined as the process margin, not only does it include the margin with respect to the film thickness direction, but also, it embraces the margin with respect to a direction along the mask surface. Thus, the component αp of margin α only in the film thickness direction is added to pattern height T.

A near-field exposure mask having an opening pattern pitch P and an opening width D, having been designed in the manner described above, is manufactured, and near-field exposure and development are carried out by use of the mask, by which a fine pattern can be produced. Details will be described below.

Figure 5:
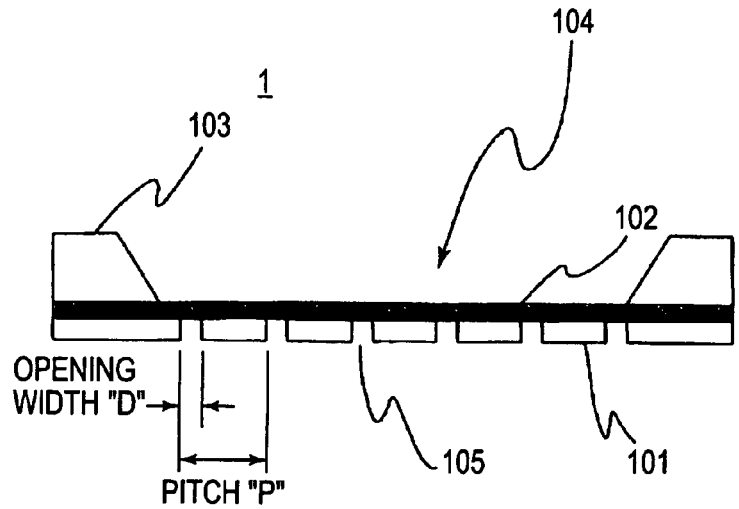
FIG. 5 is a schematic view of a general structure of a near-field exposure mask according to an embodiment of the present invention.

FIG. 5 illustrates a general structure of a near-field exposure mask according to an embodiment of the present invention. The near-field exposure mask 1 comprises a light blocking film 101, a mask base material 102 and a mask supporting member 103. A thin film portion 104 that presents an effectual near-field exposure mask, contributable to exposure, is defined by supporting the mask base material 102 through the mask supporting member 103. The light blocking film 101 may comprise a material having a low transmissivity to exposure light to be described later, such as Cr, Al, Au or Ta, for example.

The mask base material 102 may comprise a material having a transmissivity to exposure light to be described later, such as SiN, $SiO_2$, or SiC, for example, having a property different from the light blocking film 101. There are fine openings 105 formed in the light blocking film 101, the openings having a shape like a slit or a bore. These openings are formed in the thin film portion 104 constituted by the light blocking film 101 and the mask base material 102 only. As will be described later, these openings are provided so as to produce near field light (evanescent light) at a front surface of the mask in response to irradiation of the mask exposure light from the rear surface of the mask (upper surface thereof in FIG. 1).

The pitch and opening width of the fine opening pattern of the near-field exposure mask are made to be equal to P and D having been designed as described hereinbefore.

The opening pattern may be formed by use of a processing machine, such as an FIB, an EB, an X-ray or an SPM, or in accordance with a nano-imprint method or a fine pattern forming method based on near field exposure.

Next, referring to FIG. 6, a method of producing a fine pattern by use of an exposure apparatus 2, which is an example for performing exposure with use of an exposure mask 1, described above, will be explained.

Figure 6:
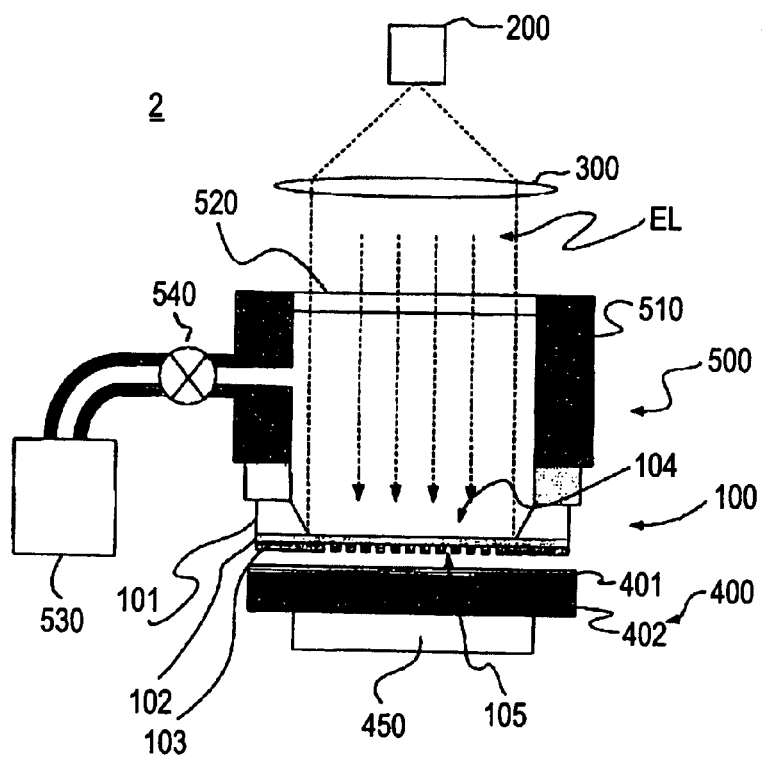
FIG. 6 is a sectional view showing a general structure of a near-field exposure apparatus according to an embodiment of the present invention.

FIG. 6 is a sectional view showing a general structure of an exposure apparatus 2 according to an embodiment of the present invention. As shown in FIG. 2, the exposure apparatus 2 comprises a light source unit 200, a collimator lens 300, an exposure mask 100, an exposure object 400 to be exposed, and a pressure adjusting system 500.

Regarding major components of the exposure apparatus 2, the exposure apparatus 2 is arranged so that, by using the exposure mask 100 that corresponds to the whole surface of the exposure object 400, a predetermined pattern formed on the exposure mask 100 is transferred to the exposure object 400 at once.

The present embodiment can be accomplished with various exposure methods such as, for example, a step-and-repeat exposure method wherein an exposure mask 100 smaller than an exposure object 100 is used and wherein exposure of a portion of the exposure object is carried out repeatedly while changing the position of the exposure subject 400, or a step-and-scan exposure method.

Here, the term "step-and-scan exposure method" refers to such a projection exposure method that an exposure mask 100 corresponding to one shot (one shot region covers one or more chip regions) is disposed opposed to one shot region of an exposure object 400, and the exposure mask 100 and the exposure object 400 are relatively and continuously scanned by exposure light, whereby a pattern of the exposure mask 100 is lithographically transferred onto the exposure object, while on the other hand, after completion of exposure of one shot, the exposure object 400 is moved stepwise so that a subsequent shot region of the exposure object 400 is disposed opposed to the exposure mask 100, and then, the scanning exposure process described above is repeated.

Also, the term "step-and-repeat exposure method" refers to such a projection exposure method that each time simultaneous exposure of one shot of an exposure object 400 is completed, the exposure object 400 is moved stepwise to move the same to the exposure region of a subsequent shot (i.e., the position to be opposed to the exposure mask 100), and then, the simultaneous exposure is repeated.

In this embodiment, when the step-and-scan exposure method or step-and-repeat exposure method is to be carried out, for every stepwise motion, a separation operation of the mask from the exposure object 400 should be done before the stepwise motion and also, an intimate-contacting operation of the mask to the exposure object 400 should be done after the stepwise motion.

The light source unit 200 has a function for producing illumination light for illuminating the exposure mask 100 having formed thereon a transfer circuit pattern to be transferred to the substrate. As an example, it may comprise an Hg lamp as a light source that can emit ultraviolet light. However, the lamp is not limited to the Hg lamp, but a xenon lamp or a deuterium lamp, for example, may be used. Also, there is no restriction in regard to the number of light sources.

Further, the light source to be used in the light source unit 100 is not limited to a lamp, but one or more lasers may be used. For example, a laser that can emit ultraviolet light or soft X-rays may be used. An ArF excimer laser having a wavelength of about 193 nm, a KrF excimer laser having a wavelength of about 248 nm, or an $F_2$ excimer laser having a wavelength of about 153 nm, for example, may be used. The type of laser is not limited to an excimer laser, and a YAG laser, for example, may be used. There is no restriction in regard to the number of lasers.

The collimator lens 300 functions to transform the illumination light emitted from the light source unit 200 into parallel light, which, in turn, is introduced into a pressurizing vessel 510 of the pressure adjusting system 500, whereby the whole surface of the exposure mask 100 or only a portion thereof, which is going to be exposed, is illuminated with a uniform light intensity.

As has been described with reference to FIG. 5, the exposure mask 100 comprises a light blocking film 101, a mask base material 102, and a mask supporting member 103. From the light blocking film 101 and the mask base material 102, a thin film 104 being elastically deformable is provided. The exposure mask 100 is arranged so that a pattern as defined by the fine opening pattern 105 of the thin film 104 is transferred to the image forming layer 401 at a unit magnification, on the basis of near field light. Here, the term "unit magnification" does not mean exact "1×" magnification, but it is mentioned to emphasize that the magnification differs from that in the transfer by reduction projection.

Regarding the exposure mask 100, the lower surface thereof as viewed in FIG. 6 is the front surface of the mask as being mounted. The light blocking film 101 is disposed outside the pressurizing vessel 510 of the pressure adjusting system 500. The thin film 104 can be elastically deformed to assure close contact with any surface irregularities of the image forming layer 401 or with any waviness of the exposure object 400.

The exposure object 400 comprises a process object substrate, such as a wafer, for example, and an image forming layer 401 applied thereto. The exposure object 400 is mounted on a stage 450.

As regards the image forming layer 401, use of a photoresist to be used in ordinary photolithography is preferable. As regards the resist material, use of one having a large contrast value is preferable. The film thickness of the resist is T, as was described hereinbefore. The application procedure for the image forming layer 401 includes a pre-process, a resist coating process and a pre-baking process.

The process object substrate can be chosen from a wide variety of materials, such as a semiconductor substrate (e.g., Si, GaAs or InP), an insulative substrate (e.g., glass, quartz or BN), or one provided by such a substrate material and having a film of metal, oxide or nitride, for example, formed thereon. However, it should be intimately contacted to the exposure mask 100 throughout the whole exposure region with a clearance of preferably not greater than 10 nm, and at least not greater than 100 nm. Therefore, for the substrate 402, one having a good flatness, as much as possible, should be chosen.

During the exposure, the image forming layer 401 and the exposure mask 100 should be close to each other for execution of exposure based on the near field light, and they are relatively approximated to each other up to a clearance of about 100 nm or less.

The stage 450 is driven by external equipment, not shown. It functions to align the exposure object 400 relatively and two-dimensionally with respect to the exposure mask 100, and also it operates to move the exposure object 400 upwardly and downwardly as viewed in FIG. 3.

The stage 450 of this embodiment has a function for moving the exposure object 400 between a loading/unloading position (not shown) and the exposure position shown in FIG. 3. At the loading/unloading position, a fresh exposure object 400 not having been exposed is loaded on the stage 450 while, on the other hand, an exposure object 400 having been exposed is unloaded therefrom.

The pressure adjusting system 500 serves to facilitate good intimate contact and separation between the exposure mask 100 and the exposure object 400, more particularly, between the thin film portion 104 and the image forming layer 401. If both of the surfaces of the exposure mask 100 and the image forming layer 401 are completely flat, they can be brought into intimate contact with each other throughout the entire surface, by engaging them with each other. Actually, however, the surfaces of the exposure mask 100, the image forming layer 401 and substrate 402 have a surface irregularity or surface waviness. Therefore, only by approximating them toward each other and bringing them into engagement with each other, the result would be a mixed distribution of intimate contact portions and non-intimate contact portions. In the non-intimate contact portion, the exposure mask 100 and the exposure object 400 are not held within a range of distance through which the near field light effectively functions. Therefore, it would result in exposure unevenness.

In consideration of it, the exposure apparatus 2 of this embodiment is provided with a pressure adjusting system 500, which comprises a pressurizing vessel 510, a light transmission window 520 made of a glass material, for example, pressure adjusting means 530, and a pressure adjusting valve 540.

The pressurizing vessel 510 can keep the gas-tightness through the combination of the light transmission window 520, the exposure mask 100 and the pressure adjusting valve 540. The pressurizing vessel 510 is connected to the pressure adjusting means 430 through the pressure adjusting valve 540, such that the pressure inside the pressurizing vessel 510 can be adjusted. The pressure adjusting means 530 may comprise a high-pressure gas pump, for example, and it functions to increase the inside pressure of the pressurizing vessel 510 through the pressure adjusting valve 540.

The pressure adjusting means 530 further comprises an exhausting pump (not shown), so that it can function to decrease the inside pressure of the pressurizing vessel 510 through a pressure adjusting valve, not shown.

The adhesion between the thin film and the image forming layer 401 can be adjusted by adjusting the inside pressure of the pressurizing vessel 510. If the surface of the exposure mask 100, the image forming layer 401 or of the substrate 402 has slightly large surface irregularities or waviness, the inside pressure of the pressurizing vessel 510 may be set at a higher level to increase the adhesion strength, thereby, to reduce dispersion of clearance between the surfaces of the mask surface 100, the image forming layer 401 and the substrate 402 due to the surface irregularities or waviness.

As an alternative, the front surface side of the exposure mask 100, as well as the image forming layer 401 and the substrate 402 side, may be disposed inside a reduced-pressure vessel 510. On that occasion, on the basis of a pressure difference with an atmospheric pressure, higher than the vessel inside pressure, a pressure may be applied to the exposure mask from its rear surface side to its front surface side, whereby the adhesion between the exposure mask 100 and the image forming layer 401 can be improved. Anyway, a pressure difference that the pressure at the rear surface side of the exposure mask 100 is higher than the pressure at the front surface side thereof, is produced. If the surface of exposure mask 100 or the surface of image forming layer 401 or substrate 401 has slightly large surface irregularities or waviness, the pressure inside the reduced pressure vessel may be set at a lower level to increase the adhesion, thereby to reduce dispersion of clearance between the mask surface and the resist surface or substrate surface.

As a further alternative, the inside of the pressurizing vessel 510 may be filled with a liquid, which is transparent with respect to the exposure light EL, and, by using a cylinder (not shown), the pressure of the liquid inside the pressurizing vessel 510 may be adjusted.

Next, the sequence of exposure using the exposure apparatus 2 will be explained.

For exposure, the stage 450 aligns the exposure object 400 with respect to the exposure mask 100 relatively and two-dimensionally.

If the alignment is completed, the stage 450 moves the exposure object 400 along a direction of a normal to the mask surface, into a range that, throughout the entire surface of the image forming layer 401, the clearance between the image forming layer 401 and the exposure mask 100 is reduced to not greater than 100 nm, so that they can be intimately contacted to each other on the basis of elastic deformation of the thin film 104.

Subsequently, the exposure mask 100 and the exposure object 400 are brought into intimate contact with each other. Specifically, the pressure adjusting valve 540 is opened and the pressure adjusting means 530 introduces a high pressure gas into the pressurizing vessel 510, whereby the inside pressure of the pressurizing vessel 510 is raised. After this, the pressure adjusting valve 540 is closed.

As the inside pressure of the pressurizing vessel 501 increases, the thin film 104 is elastically deformed and it is pressed against the image forming layer 401.

As a result, the thin film 104 is closely contacted to the image forming layer 401 with uniform pressure, throughout the entire surface and within a range in which the near field light effectively acts on the image forming layer. When pressure application is performed in the manner described above, in accordance with the Pascal's principle, the repulsive force acting between the thin film 104 and the image forming layer 401 becomes uniform. This effectively avoids a phenomenon that a large force is locally applied to the thin film 104 or the image forming layer 401, and thus, it effectively prevents local breakage of the exposure mask 100 or the exposure object 400.

In this state, the exposure process is carried out. Namely, exposure light is emitted from the light source unit 200 and it is transformed into parallel light by means of the collimator lens 300. Then, the exposure light is introduced into the pressuring vessel 510 through the glass window 520. The thus introduced light passes through the exposure mask 100, disposed inside the pressurizing vessel 510 from its rear surface side to its front surface side, that is, from the upper side to the lower side in FIG. 3, whereby near field light leaking from the pattern defined by the fine openings of the thin film 104 is produced.

The near field light is scattered within the image forming layer 401, such that the image forming layer is exposed thereby. When the thickness of the image forming layer 401 is sufficiently thin, the scattering of near field light within the image forming layer 401 does not expand largely, such that a pattern corresponding to the fine opening, smaller than the wavelength of exposure light, can be transferred to the image forming layer 401.

After the exposure is completed, a valve (not shown) is opened and the inside of the pressurizing vessel 510 is evacuated through an exhaust pump (not shown) of the pressure adjusting means 530, thereby to decrease the pressure of the pressurizing vessel 510. Then, the thin film 104 is separated (or peeled) off from the image forming layer 401 on the basis of elastic deformation.

When pressure reduction is performed in the manner described above, in accordance with Pascal's principle, the repulsive force acting between the thin film 104 and the image forming layer 401 becomes uniform. This effectively avoids a phenomenon that a large force is locally applied to the thin film 104 or the image forming layer 401, and thus, it effectively prevents local breakage of the exposure mask 100 or the exposure object 400.

After this, the exposure object 400 is moved by the stage to the loading/unloading position where it is replaced by a fresh exposure object 400. Subsequently, a similar procedure is repeated.

Here, the exposure amount can be set in the following manner.

The electrical field distribution, where a near field exposure mask prepared as described above, can be determined on the basis of simulation. Furthermore, if the relationship of the remaining film thickness after development with respect to the exposure amount of the image forming layer being used, namely, the solubility curve of the resist, is predetected, on the basis of it, the exposure amount and the developing condition are determined so that a desired pitch P and a desired pattern width W are obtained.

More specifically, first of all, from the simulation result, the electrical field contour line where a desired pattern width is obtainable when the intensity of incident light upon the near-field exposure mask is taken as one, is read out. This is denoted by "x". Also, from the resist solubility curve, the exposure amount with which the standardized remaining film thickness becomes equal to 0.5 is read out. This is denoted by "I".

Figure 7:
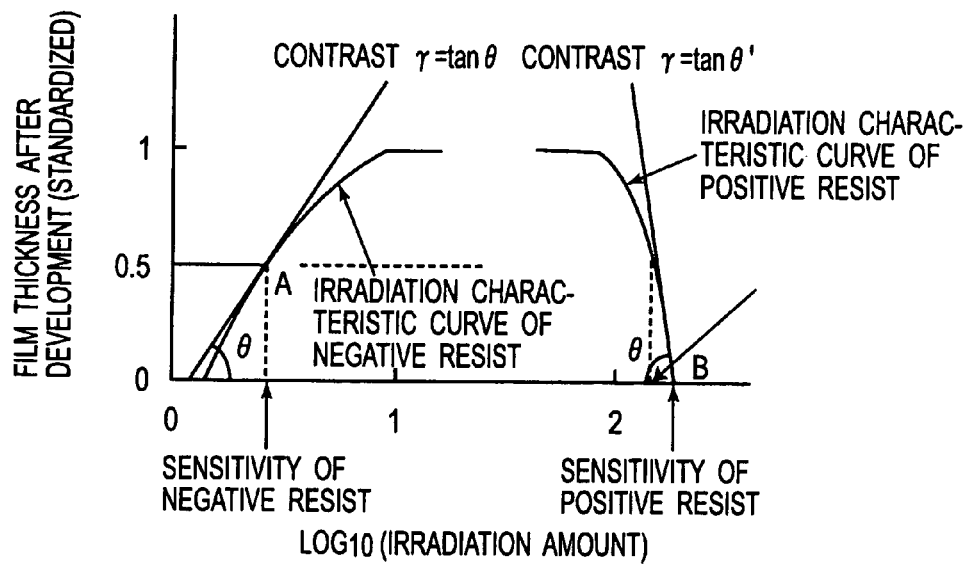
FIG. 7 is a graph illustrating a solubility curve of a certain resist.

As an example, FIG. 7 shows a solubility curve of a representative resist. If a resist being used is a negative resist, the above value takes the same value of the sensitivity. If it is a positive resist, the above value takes a value as designated in FIG. 7 by an inclined arrow.

If the intensity of incident light on the near-field exposure mask is J, then J and t that satisfy the relation:

$$I = xJt \quad (3)$$

are set as the intensity of incident light and the exposure time, respectively. Namely, Jt is set as the exposure amount.

As an example, a case will be explained in more detail with reference to FIG. 4.

First, an electrical field contour line 800 with which a desired pattern width is obtainable is chosen. Regarding the contour line 800, from the simulation result, the intensity thereof was 0.5 where the incident intensity was taken as one. Also, from the solubility curve of a resist used, the exposure amount with which the standardized remaining film thickness became equal to 0.5 was 220 mJ/cm². When light of 200 mW/cm² is used as the incident intensity, if follows from equation (3) that:

$$220 = 0.5 \times 200 \times t,$$

such that an exposure time 1.2 sec. and an exposure amount 240 mJ/cm² are calculated.

It is sufficient that the simulation is done only in regard to a near-field exposure mask having an already determined pitch and opening width, that is, only with regard to one condition. Further, the number of parameters required for conditioning the process is much reduced. Therefore, the time from a desired pattern is given, to completion of actual manufacture, is reduced considerably.

On the other hand, in regard to a near-field mask having an already determined pitch and opening width, without simulation, the exposure amount and developing condition with which a desired pattern width W is obtainable, can be determined on the basis of a formed pattern produced when the exposure amount and developing condition are changed. Since there is no necessity of repeatedly performing complicated simulations with various parameters, in the design of a near field exposure mask, the time required for the mask designing is reduced remarkably.

By developing the resist having a latent image formed therein in the manner described above, a fine resist pattern of a desired size can be produced. Thereafter, an appropriate process to the substrate, such as dry etching, wet etching, or lift-off, for example, or transfer to a background resist layer, may be carried out.

A specific example of the present invention will be explained, while specifying its numerical values.

As an example, a periodic slit structure having a pitch 200 nm and a pattern width of 20 nm is going to be produced upon an SIO (silicon-on-insulator) wafer having an SIO layer of 100 nm thickness. Applying this to the aforementioned symbols, it follows that P=200 nm and W=20 nm.

In order that the process object substrate is an SIO layer, i.e., an Si layer, and that the Si layer is etched through a depth of 100 nm, taking into account the margin of dry etching, the resist layer as the mask layer should have a thickness of not less than 100 nm. Thus, it follows that:

$$T(1+\alpha) = 100 \text{ nm}.$$

Applying this to equation (2), the left-hand term becomes negative and, thus, a buffer layer is provided between the image forming layer and the process object substrate. More specifically, a dual-layer resist method is used. A hard-baked resist layer is formed as a buffer layer upon the process object substrate, with a thickness of 100 nm. On this layer, a Si-containing resist is formed as an image forming layer, with a thickness of 20 nm. The thickness is set so that the image forming layer functions as an etching mask when the image forming layer pattern is transferred to the hard-baked layer. Specifically, T=20 nm.

Regarding the process margin, when $\alpha=1.5$ is chosen from its range "$0 \leq \alpha \leq 4$", from equation (2), the mask opening width D [nm] can be given by:

$$D = 200 - 20 - 2 \times 20 \times (1+1.5) = 80.$$

In consideration of this, a mask having a pitch of 200 nm and an opening width of 80 nm was made as a near-field exposure mask.

Using this mask, a buffer layer and an image forming layer set, as has been described above, were produced on the Si layer. Through exposure and development, a pattern having a pitch of 200 nm was produced in the image forming layer. Using this as an etching mask, an etching process was carried out with a dry etching apparatus and an oxygen gas, a slit pattern having a pitch of 200 nm and a pattern width of 20 nm was produced on the buffer layer.

Further, using the pattern of the buffer layer as an etching mask, Si was etched with a dry etching apparatus, whereby a fine Si structure having a pitch of 200 nm, a pattern width of 20 nm and a pattern height of 100 nm was produced upon an insulative film.

By the way, when a mask having any one of a variety of two-dimensionally shaped mask patterns 801, such as shown in FIGS. 9 and 10, is applied to a near-field exposure mask of the present invention such as described hereinbefore, just underneath the mask, a latent image having a two-dimensional shape, such as illustrated at 803, is produced. After exposure and development, a resist pattern 802 corresponding to it is produced.

Figure 9A:
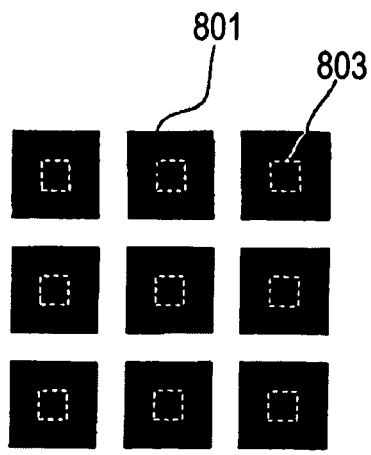
FIGS. 9A-9C' illustrate examples of resist patterns which are obtainable from masks having a two-dimensional shape pattern, wherein FIGS. 9A and 9A' are a case where a mask pattern having grid-like fine openings is used, wherein FIGS. 9B and 9B' are a case where a mask having a two-dimensional fine opening array is used, and wherein FIGS. 9C and 9C' are a case wherein a mask, whose light blocking metal film has a two-dimensional rectangular array, is used.
Figure 9A:
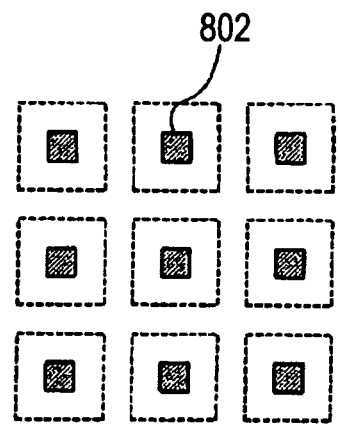

For example, with a mask pattern having grid-like fine openings (FIG. 9A), a two-dimensional dot array (in the case of a positive type resist), such as shown in FIG. 9A', or a hole array (in the case of a negative type resist), is obtainable. These patterns may be suited for production of a two-dimensionally arrayed quantum dot array to be used for an optical device or an electronic device having quantum dots.

Figure 9B:
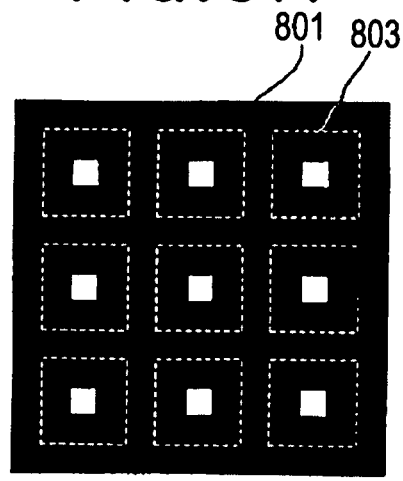
Figure 9B:
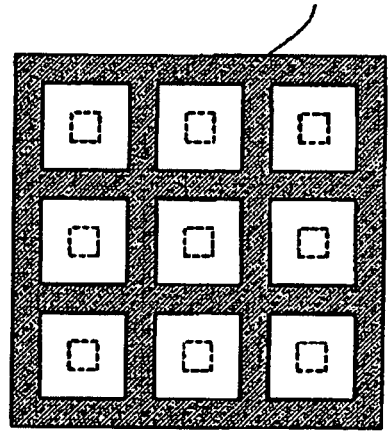

On the other hand, with a mask pattern having a two-dimensional fine-opening array, such as shown in FIG. 9B, a two-dimensional grid-like array (in the case of a positive type resist), such as shown in FIG. 9B', or a hole array (in the case of a negative type resist), is obtainable.

Figure 9C:
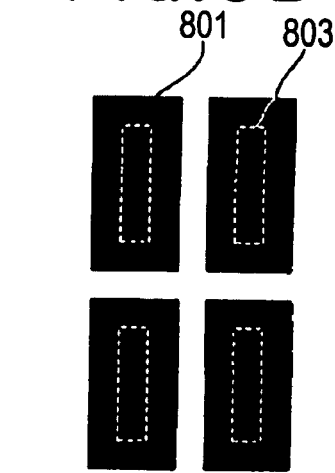
Figure 9C:
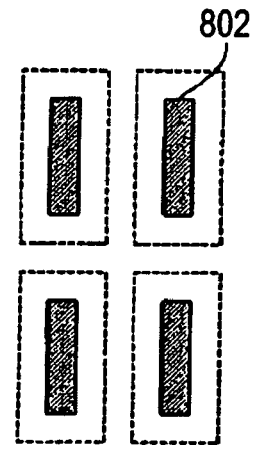

In the case of a mask pattern wherein a light blocking metal film portion has a two-dimensional rectangular array, such as shown in FIG. 9C, a two-dimensional fine-line pair (in the case of a positive type resist), such as shown in FIG. 9B', or a fine groove array (in the case of a negative type resist), is obtainable. These patterns may be suited for production of a gate pattern to be used in a CMOS electronic device.

Figure 10A:
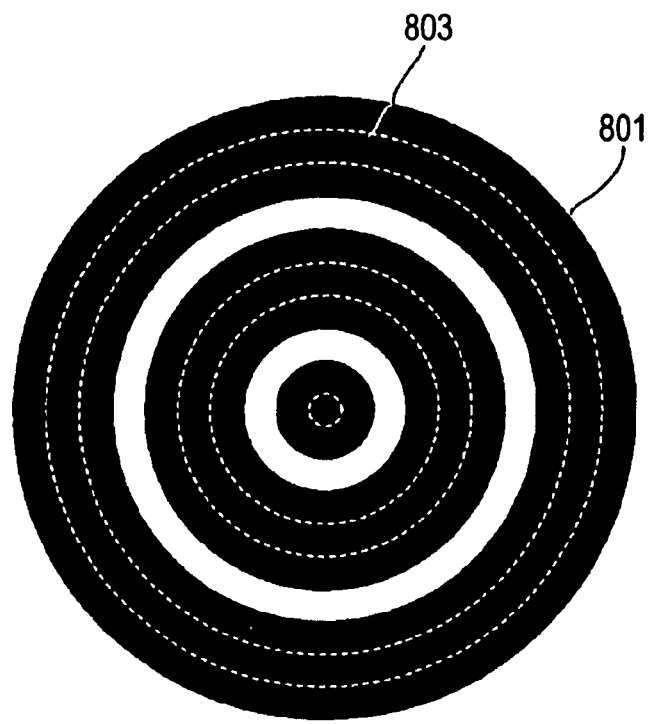
FIGS. 10A and 10B illustrate a resist pattern obtainable when a mask having a two-dimensional shape pattern is used, and specifically.
Figure 10B:
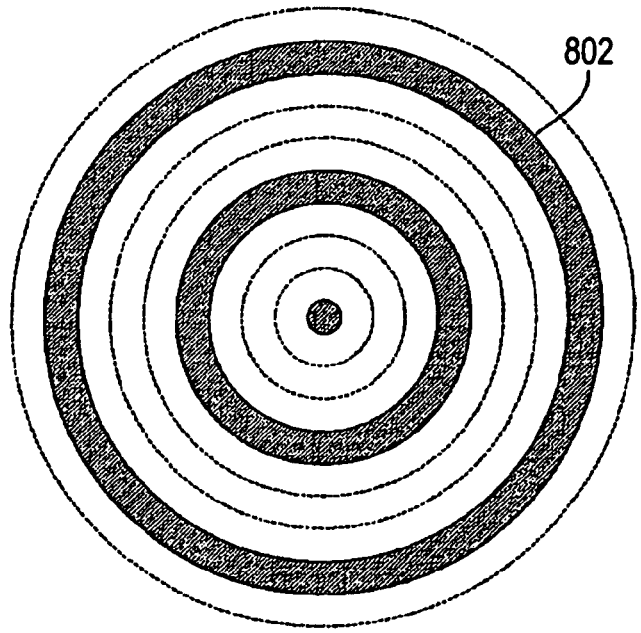

Further, in the case of a mask pattern wherein a light blocking metal film portion has a ring-like shape, such as shown in FIG. 10A, a two-dimensional dot or ring array (in the case of a positive type resist), such as shown in FIG. 10B, or a hole or ring array (in the case of a negative type resist), is obtainable.

The foregoing description has been made with reference to a method of producing a pattern having a desired pitch P, a desired pattern width W and a desired pattern height T by use of a near field exposure mask having an opening width D designed and manufactured as described hereinbefore. However, on the basis of a method, such as adjusting the exposure amount, changing the resist used, changing the developing condition, or the like, a pattern having either one or both of a pattern width W' and a pattern height T' different from W and T and satisfying the following relation, may be manufactured:

$$(W'+2T') \leq (P-D). \tag{4}$$

As an example, the exposure amount may be increased as compared with the method having been described hereinbefore, or the sensitivity of a resist used may be increased, or the developing time may be increased. Any one of them or two of them may be performed and, on that occasion, a pattern having a pattern width W' satisfying a relation W'<W, even for the same pattern height, i.e., T=T', is obtainable.

Furthermore, a pattern having a pattern width W' satisfying a relation W'>W is obtainable when any one or two of (i) choosing the image forming layer height satisfying T'<T and developing the exposure amount, (ii) decreasing the resist sensitivity, and (iii) shortening the developing time are utilized.

Figure 8:
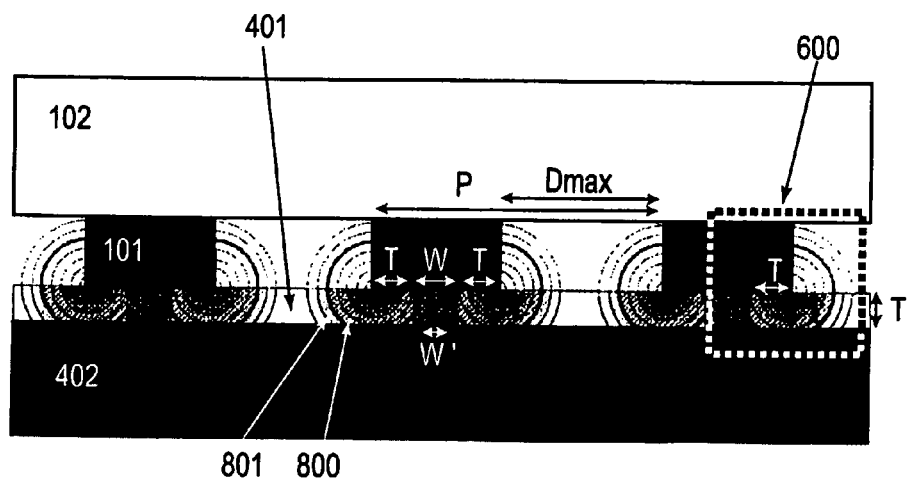
FIG. 8 is a schematic view for explaining a pattern width W' produced through near field exposure in accordance with an embodiment of the present invention.

An example will be explained in detail, with reference to FIG. 8. When a desired pattern height T' is equal to T, an electrical field contour line 801 (depicted by a thick line in FIG. 8), which is outside the electrical field contour line 800 (depicted by a thick line in FIG. 1), is chosen. Subsequently, the above-described exposure amount and developing condition are set to assure that a pattern can be produced with the field contour line 801. If a material used of the image forming layer 401 is the same, by increasing the exposure amount, for example, a pattern having a pattern width W' different from W and satisfying a relation W'<W can be produced from an already prepared mask having a pitch P and an opening width Dmax. Here, the values of W' and T' (=T) satisfy equation (4).

Subsequently, a case wherein a desired pattern to be produced is an isolated pattern, will be explained. In order to produce a pattern having a pattern width W, from the concentric-circle model described hereinbefore, a relation (5) below should be satisfied between a minimum value Kmin of the mask opening interval and the film thickness T of the image forming layer.

$$K\text{min}=W+2T \tag{5}$$

Describing it as K when the mask opening interval is not limited to a minimum value, it follows that:

$$K \geq W+2T.$$

Figure 11:
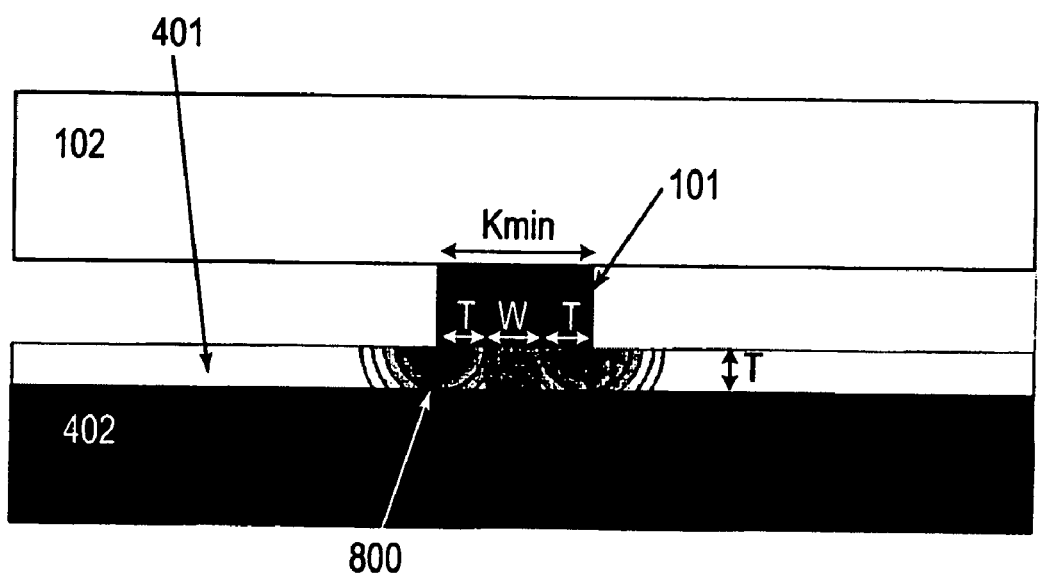
FIG. 11 is a schematic view for explaining the present invention and, specifically, it illustrates how to determine a minimum value of an opening interval of a near-field exposure mask in accordance with a concentric-circle model.

FIG. 11 shows the relationship of the values in equation (5). Thus, referring to the drawing, equation (5) will be explained in more detail.

First, the pattern height T of the image forming layer 401 by which a desired processing depth of a process object substrate 402 can be processed, is determined on the basis of a process condition, such as etching durability, for example. In order to make a pattern of this height T, it is necessary that a pattern after development is produced at the field contour line portion outside the field contour line 800, depicted by a thick line in FIG. 11.

The electrical field distribution below the light blocking film 101 is well approximated by a concentric-circle model, as described hereinbefore. It is seen from FIG. 11 that the extension from the edge portion of the light blocking film 101 is approximately even both in regard to the film thickness direction (downward direction as viewed in FIG. 11) and in a direction parallel to the mask surface (horizontal direction as viewed in FIG. 11). Therefore, if a pattern after development is produced at the electrical field contour line 800 or any electrical field contour line outside the line 800, it assures a result that a developed pattern having an extension not less than a distance T, from the edge portion of the light blocking film 101, even in the direction parallel to the mask surface, is produced.

The extension phenomenon from the edge portion of the light blocking film 101 similarly occurs at the opposite side edge of the light blocking film 101.

Thus, the minimum opening interval Kmin of the near-field exposure mask, effective to produce a pattern having a pattern width W just underneath the light blocking film 101, can be set as defined in equation (5), by using the pattern width W and height T.

The value by which the opening interval K becomes equal to Kmin is the value by which the process margin becomes equal to zero. The process margin "zero" means that the margin for the process condition, such as an exposure developing condition for the pattern formation or the process after the pattern formation, such as etching or vapor deposition, is zero. With such a "zero" margin, actually, it is very difficult to perform the pattern formation and subsequent processes for the process object substrate.

Therefore, while taking into account the process margin, the value of the opening interval K should desirably be made not less than Kmin, as given by equation (6) below:

$$K=W+2T(1+\alpha) \tag{6}$$

wherein α is the process margin. More specifically, it may be an increment of a film thickness affording a margin to the etching durability to the etching of the substrate or a background resist, an increment of film thickness of vapor deposition in the lift-off, a component of overall film thickness dissolution during the development of image forming layer, or a component of dissolution in a direction parallel to the substrate surface during the development of the image forming layer, for example.

While the value $\alpha$ varies largely with the process, in many cases, it takes a value of $0<\alpha\leq4$. If equation (6) takes a negative value in dependence upon the value of $\alpha$, a buffer layer may be provided between the image forming layer and the process object substrate as described hereinbefore, to reduce the values of $\alpha$ and T of the effective image forming layer, such that the opening interval K, having an effective and positive value, can be set.

A near-field exposure mask having an opening interval K, having been designed in the manner described above, is manufactured, and near-field exposure and development are carried out by use of the mask, by which an isolated fine pattern can be produced.

While the invention has been described with reference to the structures disclosed herein, it is not confined to the details set forth and this application is intended to cover such modifications or changes as may come within the purposes of the improvements or the scope of the following claims.

The invention claimed is:

1. A method of designing an exposure mask with a light blocking member for exposing an image forming layer provided on a substrate to near field light leaking from adjoining openings formed in the light blocking member, the method comprising:

determining a width D of the openings and an opening interval of the openings to be formed in the light blocking member, wherein a relation $D\leq(P-W-2T)$ is satisfied, where T is the height of a pattern to be produced by exposure and development prior to processing the substrate using the image forming layer, W is the linewidth of the pattern to be produced by exposure and development prior to processing the substrate, and P is the pitch of the pattern, so that an electrical field distribution, adjacent to the openings of the light blocking member as exposure light is projected on the light blocking member, is approximated to an electrical field model extending circularly concentric with an edge of the light blocking member at an image forming layer side as a center.

2. An exposure method of manufacturing an exposure mask with a light blocking member for exposing an image forming layer provided on a substrate to near field light leaking from adjoining openings formed in the blocking member, the method comprising:

determining a width D of the openings and an opening interval of the openings to be formed in the light blocking member; and processing the light blocking member so as to obtain the width D and the opening interval, wherein a relation $D\leq(P-W-2T)$ is satisfied, where T is the height of a pattern to be produced by exposure and development using the image forming layer, W is the linewidth of the pattern and P is the pitch of the pattern, so that an electrical field distribution, adjacent to the openings of the light blocking member as exposure light is projected on the light blocking member, is approximated to an electrical field model extending circularly concentric with an edge of the light blocking member at an image forming layer side as a center.

* * * * *